(12) United States Patent
Takagishi

(10) Patent No.: US 11,247,439 B2
(45) Date of Patent: Feb. 15, 2022

(54) DISPLAY UNIT

(71) Applicant: SONY SEMICONDUCTOR SOLUTIONS CORPORATION, Kanagawa (JP)

(72) Inventor: Toshiya Takagishi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 96 days.

(21) Appl. No.: 15/580,942

(22) PCT Filed: Jun. 7, 2016

(86) PCT No.: PCT/JP2016/066900
§ 371 (c)(1),
(2) Date: Dec. 8, 2017

(87) PCT Pub. No.: WO2016/204024
PCT Pub. Date: Dec. 22, 2016

(65) Prior Publication Data
US 2018/0166615 A1    Jun. 14, 2018

(30) Foreign Application Priority Data

Jun. 19, 2015 (JP) .............................. JP2015-123611

(51) Int. Cl.
*H01L 25/16* (2006.01)
*H01L 23/31* (2006.01)
(Continued)

(52) U.S. Cl.
CPC ................ *B32B 27/08* (2013.01); *B32B 7/02* (2013.01); *B32B 7/12* (2013.01); *B32B 27/28* (2013.01);
(Continued)

(58) Field of Classification Search
CPC ......... H01L 33/32; H01L 33/30; H01L 33/56; H01L 33/54; H01L 25/167;
(Continued)

(56) References Cited

U.S. PATENT DOCUMENTS 6,184,477 B1 * 2/2001 Tanahashi ............... H01L 23/50
174/261
6,518,600 B1 * 2/2003 Shaddock ............... H01L 33/56
257/100
(Continued)

FOREIGN PATENT DOCUMENTS

| JP | 2003-115613 A | 4/2003 |
|---|---|---|
| JP | 2006-024530 A | 1/2006 |

(Continued)

OTHER PUBLICATIONS

International Search Report and Written Opinion of PCT Application No. PCT/JP2016/066900, dated Aug. 30, 2016, 09 pages of ISRWO.

*Primary Examiner* — Sophia T Nguyen
(74) *Attorney, Agent, or Firm* — Chip Law Group

(57) ABSTRACT

A display unit according to an embodiment of the disclosure includes a substrate, a wiring line and a light-emission section that are provided on the substrate, an insulating layer covering the wiring line and the light-emission section, and provided on an entire surface of the substrate, and a sealing layer provided on an entire surface of the insulating layer, and including a resin material having an oxygen transmission rate higher than a water-vapor transmission rate.

10 Claims, 7 Drawing Sheets

(51) Int. Cl.

| | | |
|---|---|---|
| *H01L 33/56* | (2010.01) | |
| *H01L 33/54* | (2010.01) | |
| *B32B 27/08* | (2006.01) | |
| *H01L 23/498* | (2006.01) | |
| *H01L 23/538* | (2006.01) | |
| *G09F 9/302* | (2006.01) | |
| *G09G 3/32* | (2016.01) | |
| *B32B 27/28* | (2006.01) | |
| *B32B 7/02* | (2019.01) | |
| *B32B 27/30* | (2006.01) | |
| *B32B 7/12* | (2006.01) | |
| *B32B 27/34* | (2006.01) | |
| *H01L 33/32* | (2010.01) | |
| *H01L 33/30* | (2010.01) | |
| *B32B 27/32* | (2006.01) | |
| *B32B 27/38* | (2006.01) | |
| *H01L 25/075* | (2006.01) | |
| *H01L 33/62* | (2010.01) | |
| *H01L 23/14* | (2006.01) | |
| *G09F 9/33* | (2006.01) | |
| *B32B 27/00* | (2006.01) | |
| *G09F 9/00* | (2006.01) | |
| *G09F 9/30* | (2006.01) | |

(52) U.S. Cl.
CPC .......... *B32B 27/281* (2013.01); *B32B 27/302* (2013.01); *B32B 27/308* (2013.01); *B32B 27/325* (2013.01); *B32B 27/34* (2013.01); *B32B 27/38* (2013.01); *G09F 9/302* (2013.01); *G09G 3/32* (2013.01); *H01L 23/3107* (2013.01); *H01L 23/3114* (2013.01); *H01L 23/3121* (2013.01); *H01L 23/3135* (2013.01); *H01L 23/3192* (2013.01); *H01L 23/49811* (2013.01); *H01L 23/49833* (2013.01); *H01L 23/5384* (2013.01); *H01L 23/5385* (2013.01); *H01L 25/0753* (2013.01); *H01L 25/167* (2013.01); *H01L 33/30* (2013.01); *H01L 33/32* (2013.01); *H01L 33/54* (2013.01); *H01L 33/56* (2013.01); *H01L 33/62* (2013.01); *B32B 27/00* (2013.01); *B32B 27/32* (2013.01); *B32B 2250/02* (2013.01); *B32B 2250/03* (2013.01); *B32B 2250/24* (2013.01); *B32B 2307/71* (2013.01); *B32B 2307/7246* (2013.01); *B32B 2307/74* (2013.01); *G09F 9/00* (2013.01); *G09F 9/30* (2013.01); *G09F 9/33* (2013.01); *G09G 2300/0408* (2013.01); *G09G 2310/0221* (2013.01); *G09G 2320/062* (2013.01); *G09G 2320/064* (2013.01); *G09G 2320/0673* (2013.01); *G09G 2360/04* (2013.01); *G09G 2360/122* (2013.01); *H01L 23/142* (2013.01); *H01L 23/49822* (2013.01); *H01L 23/49827* (2013.01); *H01L 23/5383* (2013.01); *H01L 23/5386* (2013.01)

(58) Field of Classification Search
CPC ............. H01L 25/0753; H01L 23/3192; H01L 23/3135; H01L 23/3114; H01L 23/3107; H01L 23/3121; H01L 27/153; H01L 23/538–5389; H01L 27/124; H01L 27/15; H01L 27/3244; H01L 27/3276–3279; H05K 1/181; H05K 1/0298; H05K 1/0313; H05K 1/056; H05K 1/053; G09G 2300/0408; G09G 2360/04; G09G 3/32; G09G 2320/0673; G09F 9/302; B32B 2307/7246; B32B 2307/74; B32B 27/28; B32B 27/325; B32B 27/281; B32B 27/302; B32B 7/02; B32B 2250/02; B32B 2250/24; B32B 27/308

See application file for complete search history.

(56) References Cited

U.S. PATENT DOCUMENTS

| | | | | |
|---|---|---|---|---|
| 6,577,367 | B2 * | 6/2003 | Kim | G02F 1/1309 324/760.02 |
| 7,530,167 | B2 * | 5/2009 | Lauffer | H05K 1/0216 29/825 |
| 8,315,678 | B2 * | 11/2012 | Uchaykin | H01L 39/14 174/250 |
| 8,854,294 | B2 * | 10/2014 | Sakariya | G09G 3/2011 345/102 |
| 9,153,171 | B2 * | 10/2015 | Sakariya | G09G 3/3233 |
| 9,305,908 | B2 * | 4/2016 | Krabe | H01L 25/167 |
| 9,332,658 | B2 * | 5/2016 | Kunimoto | H05K 3/4602 |
| 9,537,098 | B2 * | 1/2017 | Lee | H01L 51/0096 |
| 9,648,753 | B2 * | 5/2017 | Kim | H05K 1/118 |
| 9,651,683 | B2 * | 5/2017 | Ootorii | H01L 27/14663 |
| 9,991,163 | B2 * | 6/2018 | Bower | G09F 9/33 |
| 9,997,100 | B2 * | 6/2018 | Rotzoll | G09G 3/32 |
| 10,008,639 | B2 * | 6/2018 | Gootz | H01L 33/005 |
| 2001/0040645 | A1 * | 11/2001 | Yamazaki | G02F 1/133514 349/42 |
| 2002/0030189 | A1 * | 3/2002 | Ishikawa | H01L 24/97 257/59 |
| 2002/0044111 | A1 * | 4/2002 | Yamazaki | G09G 3/3275 345/83 |
| 2003/0034497 | A1 * | 2/2003 | Yamazaki | H01L 51/5253 257/86 |
| 2003/0057422 | A1 * | 3/2003 | Yamazaki | H01L 51/5253 257/79 |
| 2004/0226745 | A1 * | 11/2004 | En | C25D 3/38 174/262 |
| 2004/0232418 | A1 * | 11/2004 | Koyama | H01L 51/5253 257/59 |
| 2005/0140265 | A1 * | 6/2005 | Hirakata | H01L 51/5259 313/483 |
| 2006/0046336 | A1 * | 3/2006 | Shoji | H01L 29/458 438/30 |
| 2006/0076694 | A1 * | 4/2006 | Chen | H01L 23/3121 257/787 |
| 2006/0132401 | A1 * | 6/2006 | Yamazaki | H01L 25/167 345/81 |
| 2007/0036927 | A1 * | 2/2007 | Funaki | B32B 1/08 428/36.91 |
| 2008/0067932 | A1 * | 3/2008 | Baek | H01L 27/3276 313/509 |
| 2009/0039762 | A1 * | 2/2009 | Park | H01L 33/504 313/502 |
| 2009/0058763 | A1 * | 3/2009 | Doi | G09G 3/3688 345/55 |
| 2009/0104443 | A1 * | 4/2009 | Suzuki | B29C 41/28 428/339 |
| 2010/0096633 | A1 * | 4/2010 | Hatano | H01L 51/5253 257/59 |
| 2010/0140638 | A1 * | 6/2010 | Kotani | B29C 45/0001 257/98 |
| 2010/0155739 | A1 * | 6/2010 | Kuramoto | C08G 59/3245 257/76 |
| 2010/0171138 | A1 * | 7/2010 | Yamazaki | H01L 27/3246 257/98 |
| 2010/0207851 | A1 * | 8/2010 | Cok | G09G 3/3208 345/82 |
| 2010/0213490 | A1 * | 8/2010 | Park | C08G 59/306 257/98 |
| 2010/0253215 | A1 * | 10/2010 | Fukagawa | H01L 51/5259 313/504 |
| 2010/0273927 | A1 * | 10/2010 | Taguchi | C08L 83/04 524/433 |

(56) References Cited

U.S. PATENT DOCUMENTS

| | | | |
|---|---|---|---|
| 2010/0301473 A1* | 12/2010 | Sasaoka | H01L 23/5389 257/737 |
| 2010/0320215 A1* | 12/2010 | Ozaki | A61K 31/4152 220/660 |
| 2011/0157762 A1* | 6/2011 | Kurashima | G06F 3/0446 361/277 |
| 2011/0211348 A1* | 9/2011 | Kim | H01L 25/0753 362/235 |
| 2011/0297942 A1* | 12/2011 | Kim | H01L 51/524 257/59 |
| 2012/0074838 A1* | 3/2012 | Im | H01L 51/5246 313/504 |
| 2012/0119233 A1* | 5/2012 | Weidner | H01L 33/486 257/88 |
| 2012/0126229 A1* | 5/2012 | Bower | H01L 21/6835 257/48 |
| 2012/0132817 A1* | 5/2012 | Shaw | G01T 1/2018 250/369 |
| 2012/0147303 A1* | 6/2012 | Yamada | G02B 1/118 349/96 |
| 2012/0168781 A1* | 7/2012 | Chun | H01B 1/22 257/88 |
| 2012/0181914 A1* | 7/2012 | Fukuda | B32B 15/08 313/46 |
| 2012/0195340 A1* | 8/2012 | Cheon | H01L 33/501 372/50.1 |
| 2012/0202923 A1* | 8/2012 | Iriguchi | C01B 33/145 523/466 |
| 2012/0235141 A1* | 9/2012 | Masubuchi | H05K 1/0225 257/48 |
| 2012/0256187 A1* | 10/2012 | Yu | H01L 27/153 257/76 |
| 2012/0256814 A1* | 10/2012 | Ootorii | G09G 3/3208 345/82 |
| 2012/0295376 A1* | 11/2012 | Lee | A61N 5/0622 438/28 |
| 2013/0026500 A1* | 1/2013 | Kim | H01L 33/50 257/88 |
| 2013/0026522 A1* | 1/2013 | Shiobara | H01L 33/486 257/98 |
| 2013/0077298 A1* | 3/2013 | Steele | F21V 23/02 362/230 |
| 2013/0099213 A1* | 4/2013 | Jun | H01L 33/502 257/40 |
| 2013/0127742 A1* | 5/2013 | Kang | G02B 5/3025 345/173 |
| 2013/0140580 A1* | 6/2013 | Wirth | H01L 25/0753 257/76 |
| 2013/0154478 A1* | 6/2013 | Ohe | H05B 33/10 315/85 |
| 2013/0244367 A1* | 9/2013 | Kohara | C08F 287/00 438/64 |
| 2013/0270588 A1* | 10/2013 | Wang | H01L 33/62 257/91 |
| 2013/0292652 A1* | 11/2013 | Son | H01L 51/5203 257/40 |
| 2014/0002385 A1* | 1/2014 | Ka | H05B 33/22 345/173 |
| 2014/0036205 A1* | 2/2014 | Sugiura | H01L 25/0753 349/69 |
| 2014/0063392 A1* | 3/2014 | Gondo | G09G 3/3611 349/41 |
| 2014/0078582 A1* | 3/2014 | Cho | G02B 5/3025 359/485.03 |
| 2014/0159026 A1* | 6/2014 | Okumoto | H01L 51/0004 257/40 |
| 2014/0203239 A1* | 7/2014 | Schubert | H01L 33/62 257/13 |
| 2014/0203310 A1* | 7/2014 | Fujii | G09F 9/33 257/89 |
| 2014/0212648 A1* | 7/2014 | Lee | B32B 27/325 428/216 |
| 2014/0264407 A1* | 9/2014 | Tischler | H01L 33/62 257/91 |
| 2014/0292840 A1* | 10/2014 | Harada | G09G 3/3426 345/694 |
| 2014/0306248 A1* | 10/2014 | Ahn | H01L 33/62 257/88 |
| 2014/0326892 A1* | 11/2014 | Ootorii | H01L 27/14663 250/366 |
| 2015/0021571 A1* | 1/2015 | Yamakita | H01L 51/56 257/40 |
| 2015/0031152 A1* | 1/2015 | Choi | H01L 51/56 438/28 |
| 2015/0090983 A1* | 4/2015 | Ozawa | H01L 27/3279 257/40 |
| 2015/0181148 A1* | 6/2015 | Slovick | H04N 5/378 348/231.99 |
| 2015/0194626 A1* | 7/2015 | Iijima | H01L 27/32 257/88 |
| 2015/0339967 A1* | 11/2015 | Shin | G06F 3/1446 345/690 |
| 2015/0367602 A1* | 12/2015 | Iwaya | C09J 7/20 428/522 |
| 2016/0033693 A1* | 2/2016 | Son | G02B 5/3033 359/487.02 |
| 2016/0049560 A1* | 2/2016 | Oh | H01L 33/504 257/98 |
| 2016/0087149 A1* | 3/2016 | Miyachi | H01L 25/0753 362/509 |
| 2016/0093547 A1* | 3/2016 | Kim | H01L 33/56 257/734 |
| 2016/0093600 A1* | 3/2016 | Bower | H01L 25/18 257/89 |
| 2016/0093833 A1* | 3/2016 | No | H01L 51/5293 257/40 |
| 2016/0119565 A1* | 4/2016 | Fujita | H04N 5/37457 348/301 |
| 2016/0129675 A1* | 5/2016 | Yamaguchi | B32B 27/365 428/412 |
| 2016/0155391 A1* | 6/2016 | Takesue | G06F 3/1438 345/690 |
| 2016/0155986 A1 | 6/2016 | Ito | |
| 2016/0189985 A1* | 6/2016 | Kasai | H01L 21/566 438/127 |
| 2016/0196793 A1* | 7/2016 | Xu | G09G 3/3611 345/694 |
| 2016/0247787 A1* | 8/2016 | Chen | H01L 25/075 |
| 2016/0284956 A1* | 9/2016 | Ahn | H01L 33/36 |
| 2016/0322540 A1* | 11/2016 | Moran | H01L 24/96 |
| 2016/0343771 A1* | 11/2016 | Bower | H01L 21/77 |
| 2016/0351619 A1* | 12/2016 | Cramer | H04B 1/3888 |
| 2016/0372640 A1* | 12/2016 | Ogawa | H01L 33/56 |
| 2017/0031221 A1* | 2/2017 | Sugimoto | G02F 1/1368 |
| 2017/0057209 A1* | 3/2017 | Omori | B32B 27/00 |
| 2017/0061867 A1* | 3/2017 | Cok | G09G 3/3208 |
| 2017/0076675 A1* | 3/2017 | Hatanaka | G09G 3/20 |
| 2017/0100926 A1* | 4/2017 | Kano | B32B 9/02 |
| 2017/0103926 A1* | 4/2017 | Aoyagi | H01L 25/0753 |
| 2017/0137203 A1* | 5/2017 | Arakawa | B32B 27/08 |
| 2017/0153766 A1* | 6/2017 | Kimura | G02F 1/133509 |
| 2017/0165950 A1* | 6/2017 | Leatherdale | B32B 7/12 |
| 2017/0187976 A1* | 6/2017 | Cok | H04N 5/376 |
| 2017/0207415 A1* | 7/2017 | Ii | B32B 9/00 |
| 2017/0230592 A1* | 8/2017 | Goto | H04N 5/347 |
| 2017/0232718 A1* | 8/2017 | Iwase | B32B 7/02 428/524 |
| 2017/0243342 A1* | 8/2017 | Iwami | H04N 9/735 |
| 2017/0282507 A1* | 10/2017 | Dou | B29C 48/022 |
| 2017/0285817 A1* | 10/2017 | Mori | G06F 3/044 |
| 2017/0320292 A1* | 11/2017 | Isoda | B32B 3/30 |
| 2017/0345767 A1* | 11/2017 | Watanabe | H01L 33/62 |
| 2018/0018047 A1* | 1/2018 | Iwami | G06F 3/044 |
| 2018/0062047 A1* | 3/2018 | Biwa | H01L 33/46 |
| 2018/0097201 A1* | 4/2018 | Fujimaki | H01L 51/5275 |
| 2018/0166615 A1* | 6/2018 | Takagishi | B32B 27/00 |
| 2018/0174973 A1* | 6/2018 | Aoyagi | H01L 25/167 |
| 2018/0232080 A1* | 8/2018 | Iwami | H05K 9/0096 |

(56) References Cited

U.S. PATENT DOCUMENTS

| | | | |
|---|---|---|---|
| 2018/0277528 A1* | 9/2018 | Hasegawa | H01L 25/0753 |
| 2019/0235289 A1* | 8/2019 | Asatani | G02F 1/133615 |
| 2021/0191019 A1* | 6/2021 | Toda | H04N 9/07 |

FOREIGN PATENT DOCUMENTS

| | | | |
|---|---|---|---|
| JP | 2006-127815 A | 5/2006 | |
| JP | 2006-334909 A | 12/2006 | |
| JP | 2007-273498 A | 10/2007 | |
| JP | 2008-226471 A | 9/2008 | |
| JP | 2009-081122 A | 4/2009 | |
| WO | 2008/032526 A1 | 3/2008 | |
| WO | 2015/012404 A1 | 1/2015 | |

* cited by examiner

[ FIG. 1 ]
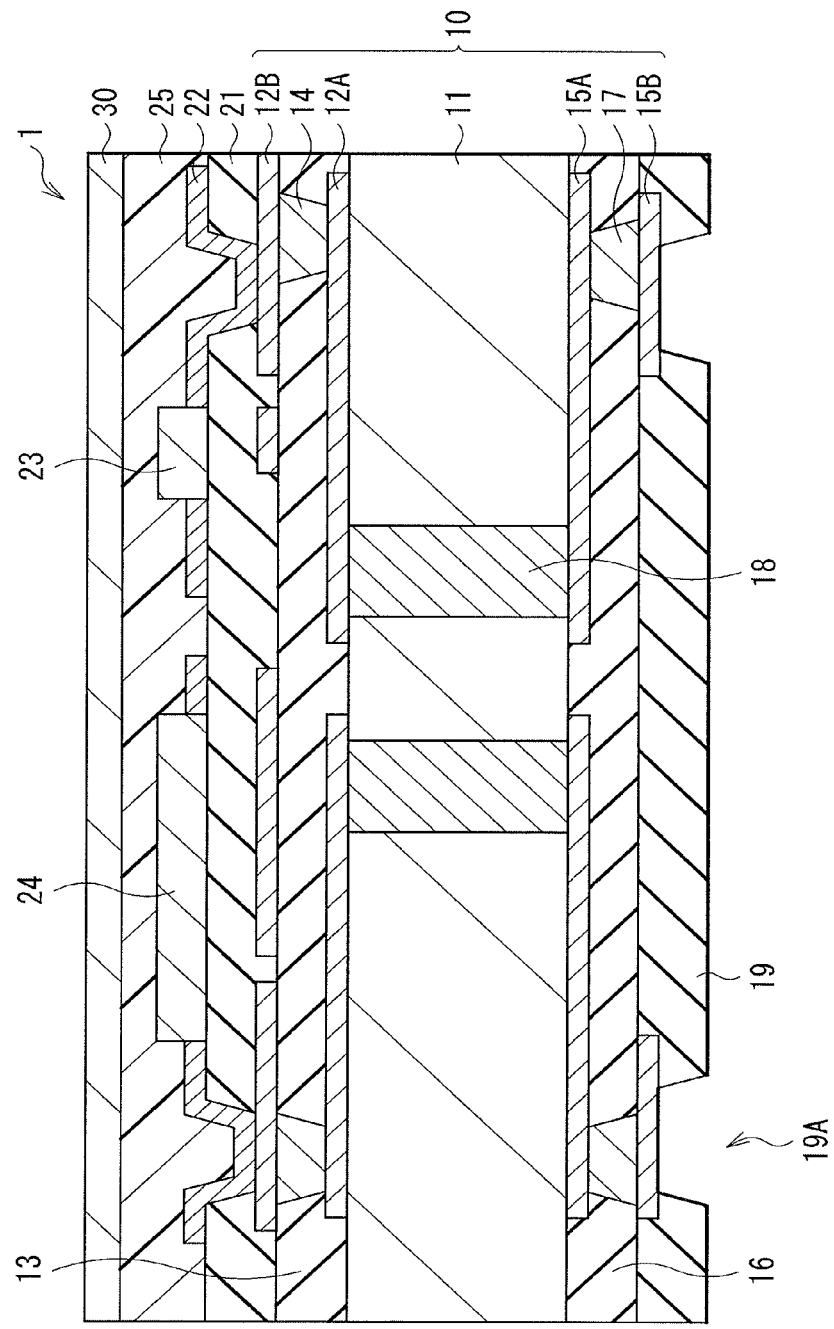

[ FIG. 2 ]
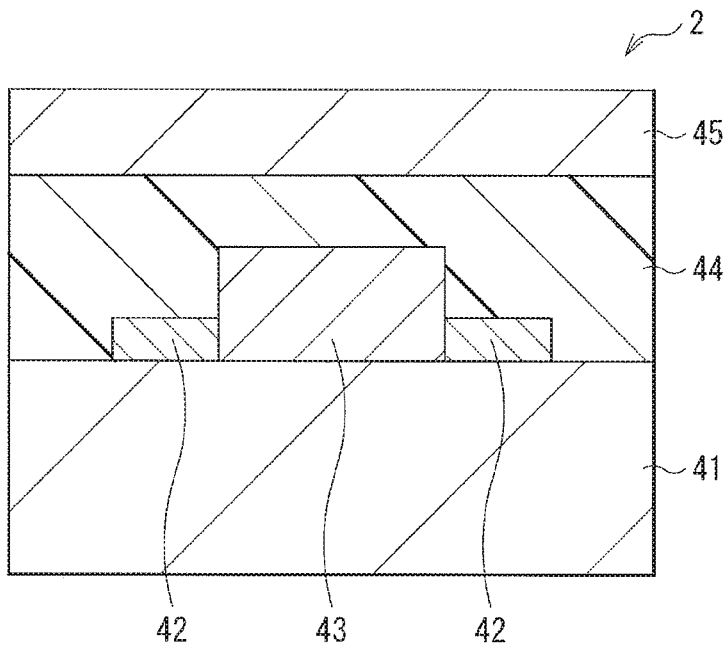
[ FIG. 3 ]
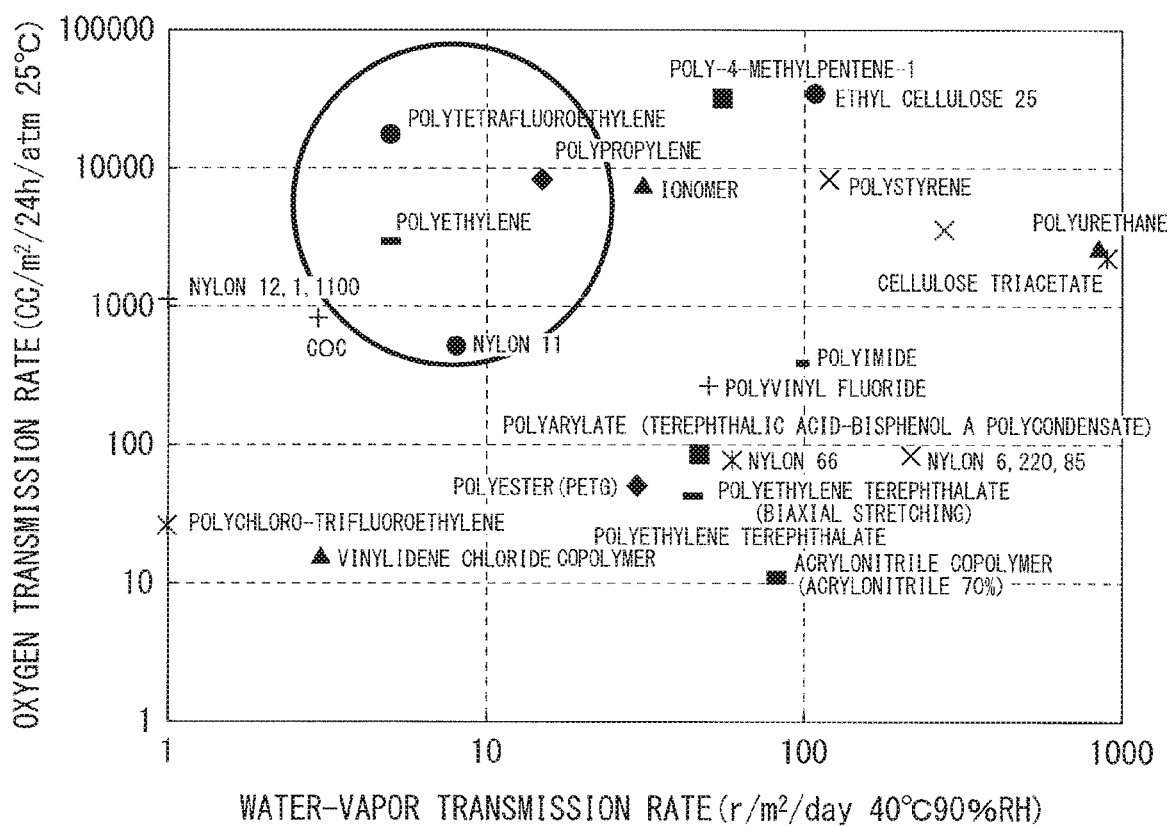

[ FIG. 4 ]
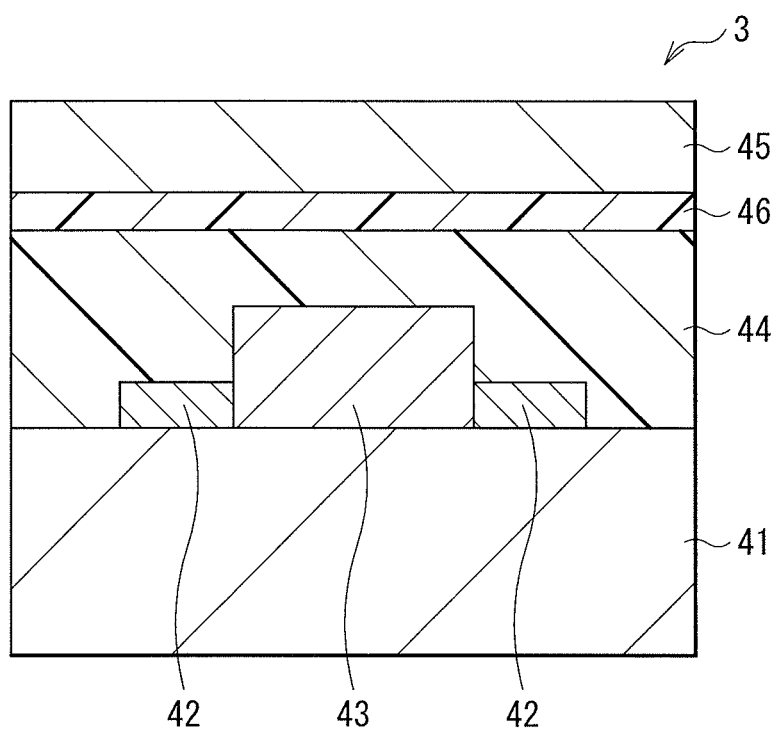

[ FIG. 5A ]
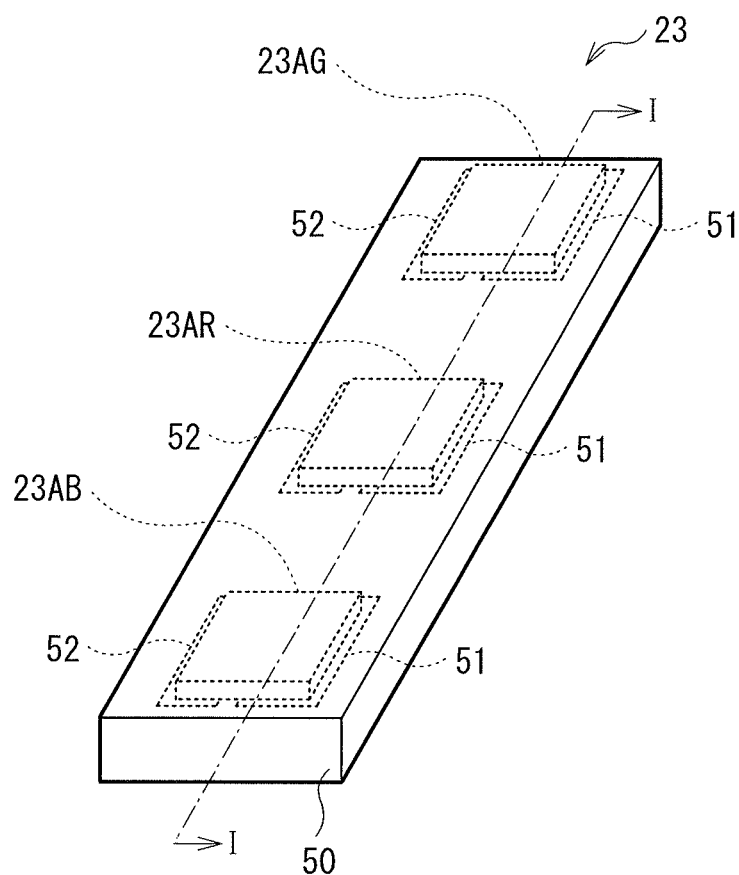
[ FIG. 5B ]
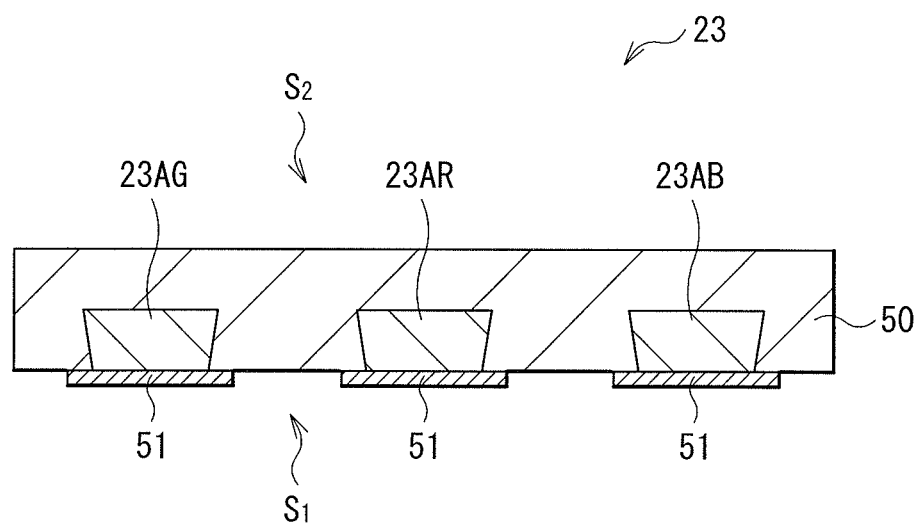

[ FIG. 6 ]
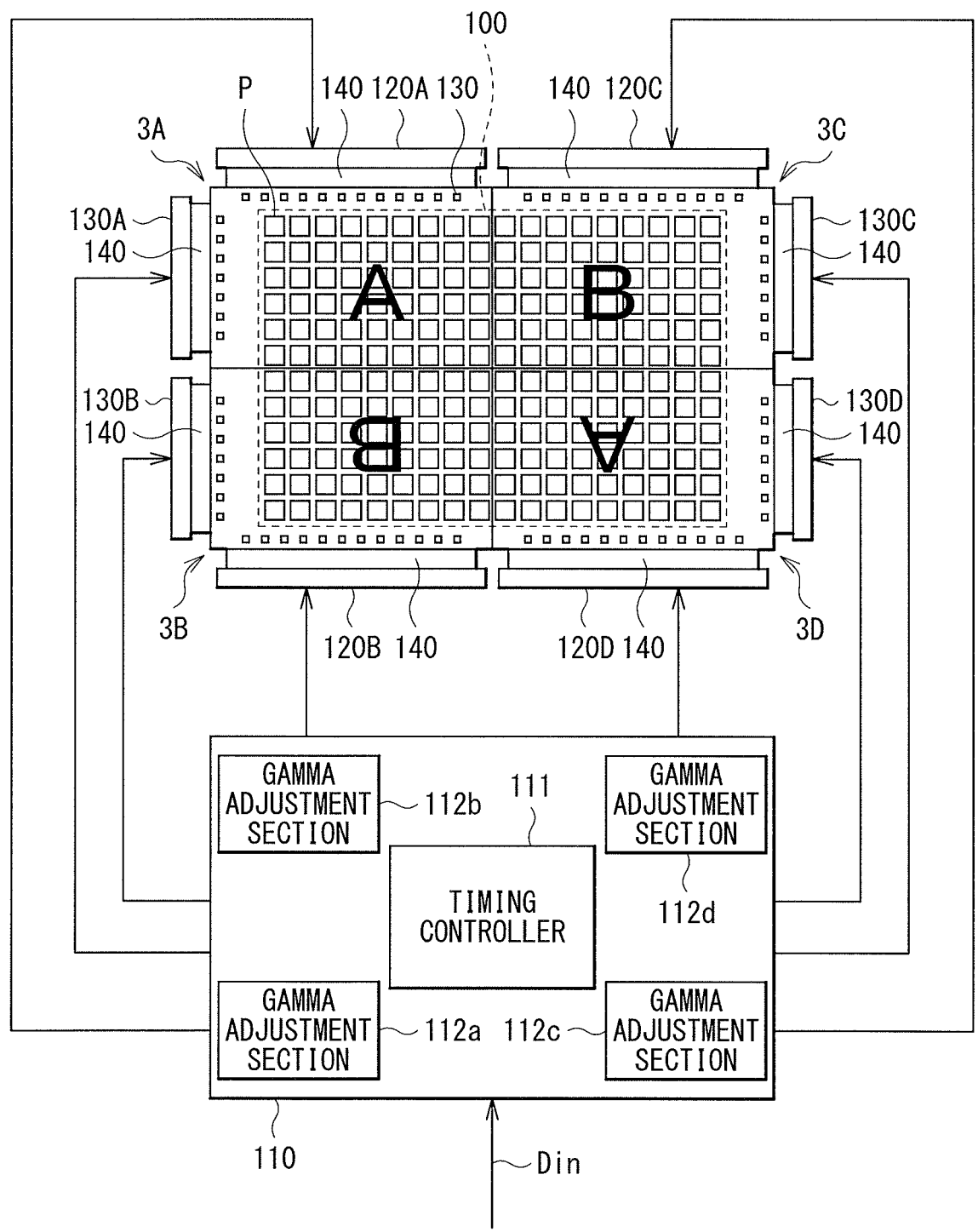

[ FIG. 7A ]
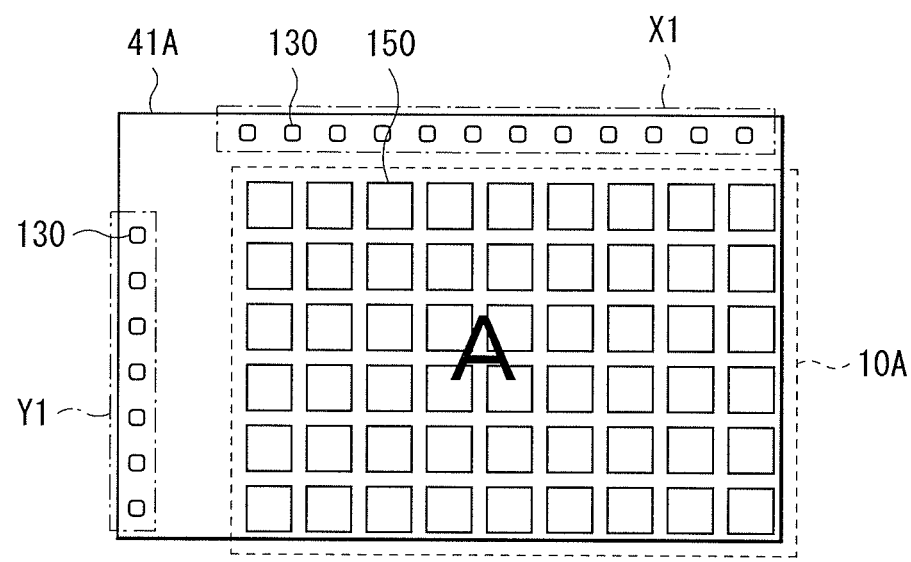
[ FIG. 7B ]
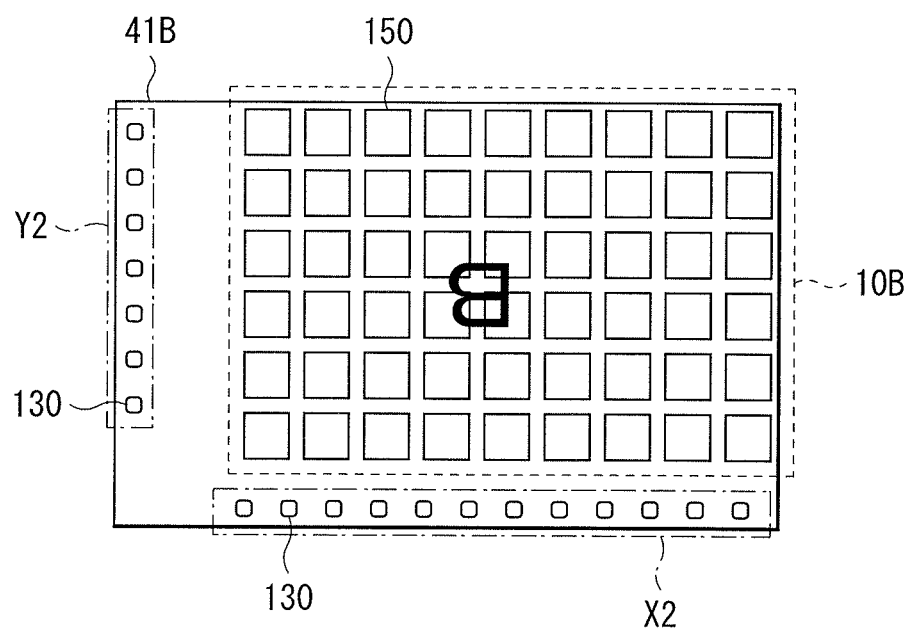

[ FIG. 8 ]
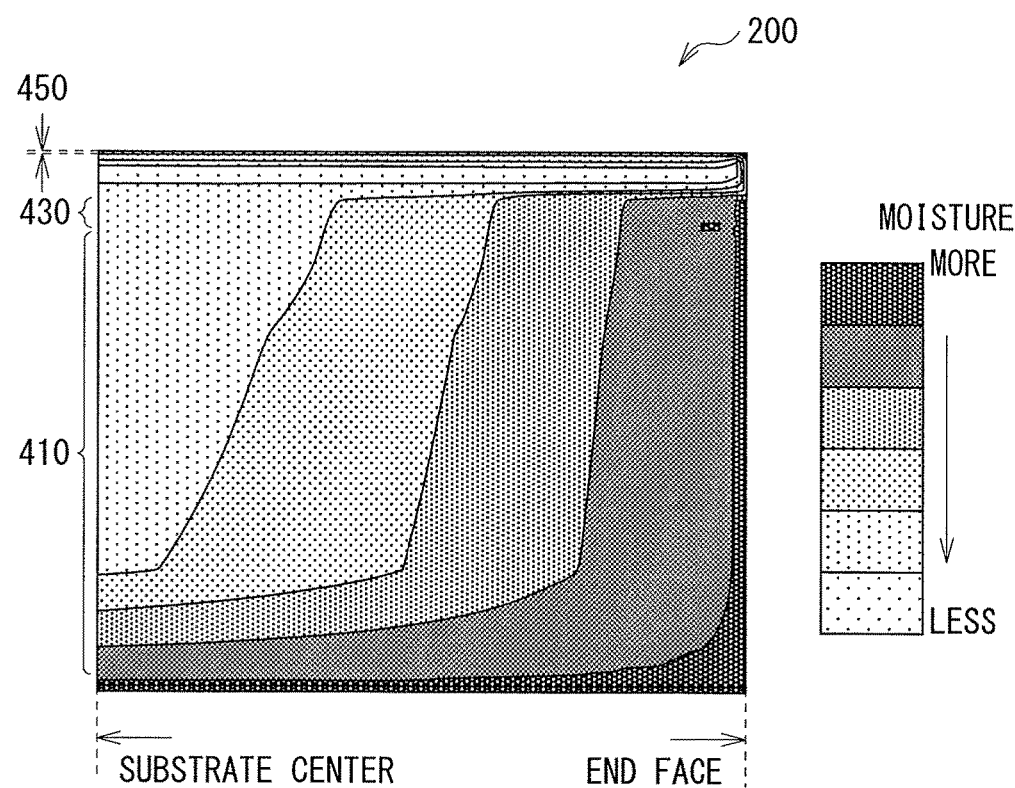
[ FIG. 9 ]
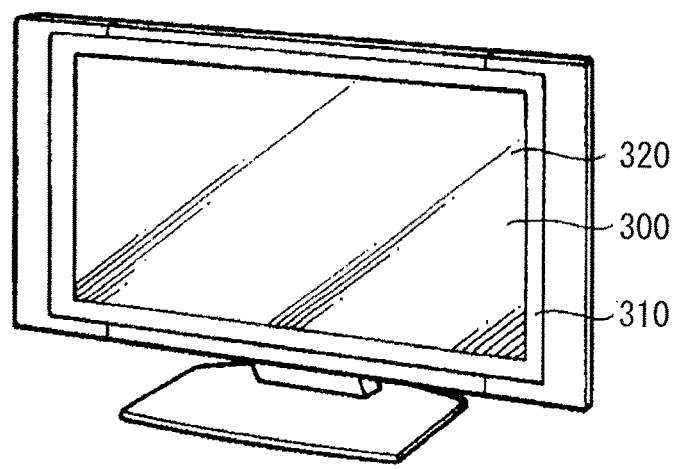

DISPLAY UNIT

CROSS REFERENCE TO RELATED APPLICATIONS

This application is a U.S. National Phase of International Patent Application No. PCT/JP2016/066900 filed on Jun. 7, 2016, which claims priority benefit of Japanese Patent Application No. JP 2015-123611 filed in the Japan Patent Office on Jun. 19, 2015. Each of the above-referenced applications is hereby incorporated herein by reference in its entirety.

TECHNICAL FIELD

The technology relates to a display unit including, for example, a light-emitting diode (LED) as a light-emission device.

BACKGROUND ART

In a wiring board in which a conductive pattern and a resin layer covering the conductive pattern are provided on a surface of a substrate, there is a possibility that ionic migration occurs at a live part of the conductive pattern due to entering of moisture from outside, and thereby a short circuit occurs between wiring lines.

Conceivable methods of suppressing occurrence of ionic migration include increasing a wiring interval, lowering a voltage between wiring lines, using a resin material having a small amount of remaining ions that couple to a wiring line (e.g., a copper (Cu) wiring line), and providing a member that suppresses entering of moisture from outside. Of these, the wiring interval, application of the voltage, and the resin material are determined by other factors in designing a device and thus, it is difficult to make a modification thereto. Hence, a method of providing a member that suppresses entering of moisture from outside is used. Specifically, entering of moisture is suppressed by forming an inorganic barrier layer on an insulating layer by vapor deposition, or by attaching a film, on which an inorganic barrier layer is formed, to a substrate.

Incidentally, to improve performance of an electronic device, the number of wiring lines is increased, which makes a circuit complicated. In particular, in a display unit, etc., the number of thin film transistors (TFTs) and the number of wiring lines are large, and moreover, a circuit is more complicated due to capacitor enlargement, etc. Further, there is such an issue that, in a case where definition increases, density of a wiring layer forming wiring lines and signal lines for driving increases as the number of pixels increases. Therefore, a short circuit between wiring lines easily occurs, which decreases a manufacturing yield. In contrast, for example, PTL 1 discloses an image display unit that uses a so-called multilayered wiring board, in which a footprint of an electronic component is increased, while an increase in density of wiring lines is reduced, by forming a wiring pattern inside a substrate.

CITATION LIST

Patent Literature

PTL 1: Japanese Unexamined Patent Application Publication No. 2003-115613

SUMMARY OF INVENTION

For example, a printed circuit board is configured of a base material having an insulation property and an organic resin material such as an epoxy resin. In a case where an inorganic barrier layer is provided on a substrate (an organic substrate) including such an organic resin material, entering of moisture from the inorganic barrier layer surface is suppressed. However, there is such an issue that a void occurs due to peeling off of an interface between the organic substrate, which has weak adhesion due to moisture contained in the organic substrate and gas generated from the organic resin material, and the inorganic barrier layer.

Accordingly, it is desirable to provide a display unit that makes it possible to reduce occurrence of film peeling, while suppressing entering of moisture.

A display unit according to an embodiment of the technology includes: a substrate; a wiring line and a light-emission section that are provided on the substrate; an insulating layer covering the wiring line and the light-emission section, and provided on an entire surface of the substrate; and a sealing layer provided on an entire surface of the insulating layer, and including a resin material having an oxygen transmission rate higher than a water-vapor transmission rate.

In the display unit of the embodiment of the technology, the sealing layer that includes the resin material having the oxygen transmission rate higher than the water-vapor transmission rate is provided on the insulating layer that covers the wiring line and the light-emission section provided on the substrate. Thereby, moisture contained in the substrate and generated gas are moderately released to outside.

According to the display unit of the embodiment of the technology, the sealing layer that includes the resin material having the oxygen transmission rate higher than the water-vapor transmission rate is provided on the insulating layer that covers the wiring line and the light-emission section provided on the substrate. The moisture contained in the substrate and the generated gas are thereby moderately released to outside. It is therefore possible to reduce occurrence of film peeling, while suppressing entering of moisture from outside. It is to be noted that effects described above are not limitative, and may be any of effects described in the disclosure.

BRIEF DESCRIPTION OF DRAWINGS

FIG. 1 is a cross-sectional view illustrating a configuration of a display unit (a display unit panel) according to an embodiment of the disclosure.

FIG. 2 is a schematic cross-sectional view illustrating an example of a main-part configuration of the display unit illustrated in FIG. 1.

FIG. 3 is a characteristic diagram illustrating a relationship between an oxygen transmission rate and a water-vapor transmission rate of a resin material.

FIG. 4 is a schematic cross-sectional view illustrating another example of a main-part configuration of the display unit illustrated in FIG. 1.

FIG. 5A is a perspective view illustrating a configuration of a light-emission unit used in the display unit illustrated in FIG. 1.

FIG. 5B is a cross-sectional view illustrating an example of a configuration of the light-emission unit illustrated in FIG. 5A.

FIG. 6 is a diagram illustrating an overall configuration of a display apparatus using the display unit panel illustrated in FIG. 1.

FIG. 7A is a schematic plan view for description of a configuration of a backplane.

FIG. 7B is a schematic plan view for description of a configuration of a backplane.

FIG. 8 is a moisture distribution map for description of entering of moisture in a typical display unit.

FIG. 9 is a perspective view illustrating an appearance of an application example.

DESCRIPTION OF EMBODIMENTS

An embodiment of the disclosure will be described below in detail with reference to the drawings. It is to be noted that the description will be provided in the following order.
1. Embodiment (an example in which a sealing layer including a resin material having an oxygen transmission rate higher than a water-vapor transmission rate is provided on an insulating layer)
   1-1. Basic Configuration
   1-2. Configuration of Display Unit
   1-3. Working and Effect
2. Application Example 1. Embodiment (1-1. Basic Configuration)

FIG. 1 illustrates a cross-sectional configuration of a display unit (a display unit 1) according to an embodiment of the disclosure. FIG. 2 schematically illustrates a cross-sectional configuration of a main part of the display unit illustrated in FIG. 1, and this main part is illustrated as a device substrate 2. The display unit 1 configures, for example, a large-size display apparatus in which a plurality of display units (display panels) are combined, as represented by a tiling display illustrated in FIG. 6, and will be hereinafter described as the display unit 1 for convenience. In the display unit 1 of the present embodiment, a wiring line 42 and a light-emission section 43 are provided on a substrate 41, as illustrated in FIG. 2. The display unit 1 has a configuration in which a sealing layer 45 configured of a resin material having an oxygen transmission rate higher than a water-vapor transmission rate is provided on an insulating layer 44 formed to cover the wiring line 42 and the light-emission section 43. A main point of the technology using the device substrate 2 will be described below.

The substrate 41 is configured of an organic base material, e.g., a film base material made of a glass-containing resin such as FR4 (a glass epoxy resin) and CEM3 (a glass composite resin). Alternatively, the substrate 41 is configured of, other than a glass substrate, a plastic substrate of polyether sulfone, polycarbonate, polyimides, polyamides, polyacetals, polyesters (polyethylene terephthalate, polyethylene naphthalate), polyethyl ether ketone, polyolefins, etc., or a metallic foil substrate, on which an insulation surface treatment is performed, of aluminum (Al), nickel (Ni), copper (Cu), stainless steel, etc., or paper. Besides, there may be used a substrate in which an insulating resin layer based on polyimide, or epoxy, etc. is formed on a surface of a metal base substrate of Al, etc., and a wiring pattern of the above-described reflective material is printed on this insulating resin layer.

The wiring line 42 is configured of, for example, a simple metal or an alloy of copper (Cu), platinum (Pt), titanium (Ti), ruthenium (Ru), molybdenum (Mo), Cu, tungsten (W), Ni, Al, tantalum (Ta), etc. In particular, it is preferable to use Cu that has low resistivity, and enables a speedup by reducing a wiring delay time.

As will be described later in detail, the light-emission section 43 is, for example, a solid-state light-emission device that emits light in a predetermined wavelength band from a top surface, and specifically, an LED chip.

The insulating layer 44 covers the wiring line 42 and the light-emission section 43, and it is preferable to use, for example, a material having light resistance, in order to suppress deterioration attributable to exposure to the light emitted from the light-emission section 43. Specific materials include organic insulating materials based on silicone, polyimide, polyacrylate, epoxy, cresol novolac or polystyrene, polyamide, fluorine, etc. It is to be noted that the material to be used for the insulating layer 44 is not limited to the organic insulating materials, and, for example, inorganic insulating materials may be used.

The sealing layer 45 is provided on the insulating layer 44, and seals the wiring line 42 and the light-emission section 43, and to suppress entering of moisture into the display unit 1 to be described later. In the present embodiment, it is preferable that the sealing layer 45 be made of a material that makes it possible to release gas generated from the substrate 41, the insulating layer 44, etc. to outside, while suppressing entering of moisture from outside (a surface). Specifically, it is preferable to use, for example, a low vapor-transmission film. The low vapor-transmission film is preferably such a film that a ratio between a moisture permeability of the substrate 41 and a moisture permeability of the film is small, and, for example, the moisture permeability of the low vapor-transmission film is preferably less than 10 times the moisture permeability of the substrate. This reduces occurrence of ionic migration in the wiring line 42 due to entering of moisture from outside, and suppresses occurrence of a void, etc., due to generation of gas from inside (an organic resin material).

For a material of such a low vapor-transmission film, a material having an oxygen transmission rate ($CC/m^2/24$ h/atm; 25° C.) ten times or greater a water-vapor transmission rate ($g/m^2$/day, 40° C. 90% RH) is preferable. Use of such a material suppresses entering of moisture from outside, while moderately releasing gas generated from an organic resin material to outside. Table 1 provides a water-vapor transmission rate ($g/m^2$/day, 40° C. 90% RH), an oxygen transmission rate ($CC/m^2/24$ h/atm; 25° C.), and a carbon-dioxide transmission rate ($CC/m^2/24$ h/atm; 25° C.) of each of various resin materials. FIG. 3 illustrates a distribution of a water-vapor transmission rate ($g/m^2$/day, 40° C. 90% RH) and an oxygen transmission rate ($CC/m^2/24$ h/atm; 25° C.) of each of various resin materials. Materials each indicated with a circle illustrated in FIG. 3 has a large ratio of the oxygen transmission rate to the water-vapor transmission rate, and the ratio is, for example, 10 or more. It is to be noted that a more preferable material of the low vapor-transmission film has a water-vapor transmission rate of 10 ($g/m^2$/day, 40° C. 90% RH) or less and an oxygen transmission rate of 100 ($CC/m^2/24$ h/atm; 25° C.) or more, and more desirably has a water-vapor transmission rate of 5 ($g/m^2$/day, 40° C. 90% RH) or less and an oxygen transmission rate of 520 ($CC/m^2/24$ h/atm; 25° C.) or more. In other words, examples of a specific material of the low vapor-transmission film include a cyclic olefin resin, a nylon resin, a polyethylene resin, etc. In a case where the sealing layer 45 using the cyclic olefin resin is provided on the insulating layer 44, a good result is obtained. It is to be noted that specific examples of the cyclic olefin resin include an addition polymerization cycloolefin resin and a ring-opening polymerization cycloolefin resin.

TABLE 1

| | Film thickness (μm) | Water-vapor transmission rate (g/m$^2$/day, 40° C. 90% RH) | Oxygen transmission rate (CC/m$^2$/24 h/ atm, 25° C.) | Carbon-dioxide transmission rate (CC/m$^2$/24 h/ atm, 25° C.) |
|---|---|---|---|---|
| Ethylene-vinylalcohol copolymer (ethylene 56%) | 15 | 120 | 0.2 | 1.1 |
| Acrylonitrile copolymer (acrylonitrile 70%) | 25 | 82 | 12 | 25 |
| Vinylidene chloride copolymer | 25 | 3 | 16 | 13 |
| Nylon 6 | 20 | 220 | 85 | 450 |
| Nylon 66 | 25 | 60 | 77 | 140 |
| Nylon 11 | 25 | 8 | 520 | 2,300 |
| Nylon 12 | 25 | 1 | 1,100 | 3,200 |
| Polyethylene terephthalate (biaxial stretching) | 12 | 55 | 64 | 175 |
| Polyethylene terephthalate | 30 | 45 | 43 | 430 |
| Polyester (PETG) | 50 | 30 | 50 | 150 |
| Polyarylate (terephthalic acid-bisphenol A polycondensate) | 30 | 47 | 86 | 660 |
| Polyurethane 25 | 25 | 850 | 2,700 | 14,000 |
| Polyvinyl chloride (nonplasticized) | 25 | 45 | 125 | 760 |
| Polyvinyl chloride (plasticizer 30%) | 50 | 40 | 1,820 | 120,000 |
| Polycarbonate | 50 | 24 | 1,800 | 10,100 |
| Polystyrene | 25 | 120 | 8,100 | 37000 |
| Polychloro-trifluoroethylene | 25 | 1 | 26 | 180 |
| Polytetrafluoroethylene | 25 | 5 | 17,600 | 48000 |
| Polyvinyl fluoride | 50 | 50 | 260 | |
| Polyimide | 25 | 96 | 390 | 620 |
| Polyethylene (density 0, 955) | 25 | 5 | 2,900 | 7,600 |
| Polypropylene 20 | 20 | 15 | 8100 | 37000 |
| Poly-4-methylpentene-1 | 50 | 55 | 32,000 | 95000 |
| Ionomer 25 | 25 | 31 | 7,700 | |
| Polysulfone | 25 | 280 | 3,500 | 14,000 |
| Cellulose triacetate | 25 | 900 | 2,300 | 12,600 |
| Ethyl cellulose 25 | 25 | 108 | 35,000 | 80,000 |
| COC | 25 | 3.2 | 800 | |
| COC | 100 | 0.8 | 200 | |
| COP | 100 | 1 | | |

The sealing layer 45 may be directly provided on the insulating layer 44 as illustrated in FIG. 2, or may be provided with an intermediate layer 46 interposed therebetween as illustrated in FIG. 4. The intermediate layer 46 is, specifically, formed of a bond or adhesive. In this way, the sealing layer 45 may be fixed (attached) to the insulating layer 44 with the intermediate layer 46 interposed therebetween.

(1-2. Configuration of Display Unit)

In the display unit (the display unit 1) of the present embodiment, as illustrated in FIG. 1, for example, a wiring line 22 and electronic devices, e.g., a light-emission unit 23 (a light-emission section), a driver IC (integrated circuit) 24, etc., are provided on a substrate 10, with an insulating layer 21 interposed therebetween, while being covered by an insulating layer 25. Further, a sealing layer 30 is disposed on the insulating layer 25. Here, the substrate 10, the wiring line 22, the light-emission unit 23, the insulating layer 25, and the sealing layer 30 correspond to the substrate 41, the wiring line 42, the light-emission section 43, the insulating layer 44, and the sealing layer 45, respectively, in the device substrate 2 described above. It is to be noted that, in the substrate 10, a plurality of wiring lines (wiring lines 12A, 12B, 15A, and 15B), etc., are disposed on a front surface and a back surface of a base material 11.

The substrate 10 is a so-called multilayered wiring board, in which various kinds of wiring lines are formed inside or on a front surface and a back surface of a film base material made of a glass-containing resin represented by FR4 (a glass epoxy resin), CEM3 (a glass composite resin), etc. Specifically, there are provided, for example, the base material 11 made of FR4, the wiring line 12A as well as the wiring line 12B stacked on the front surface of the base material 11 with an insulating layer 13 interposed therebetween, and the wiring line 15A as well as the wiring line 15B stacked on the back surface of the base material 11 with an insulating layer 16 interposed therebetween. The wiring line 12A and the wiring line 12B are electrically coupled to each other by a bump 14 that penetrates through the insulating layer 13, and the wiring line 15A and the wiring line 15B are electrically coupled to each other by a bump 17 that penetrates through the insulating layer 16. The wiring line 12A and the wiring line 15A are electrically coupled to each other, with a through electrode 18 interposed therebetween and penetrating through the base material 11. Further, on the wiring line 15B provided on back-surface side of the base material 11, an insulating layer 19 is provided as a protective film. In the insulating layer 19, for example, an opening 19A to couple the wiring line 15B and an external circuit (not illustrated) is provided at any position.

The wiring lines 12A, 12B, 15A, and 15B are provided in a selective region on the base material 11, and configured of, for example, a simple metal or an alloy of copper (Cu), platinum (Pt), titanium (Ti), ruthenium (Ru), molybdenum (Mo), Cu, tungsten (W), Ni, Al, tantalum (Ta), etc. In particular, it is preferable to use Cu that has low resistivity, and enables a speedup by reducing a wiring delay time. Further, two or more kinds of these may be stacked and used. It is possible to use a material similar to that of the wiring lines 12A, 12B, 15A, and 15B, also for the bumps 14 and 17 as well as the through electrode 18.

The insulating layers 13, 16, and 19 are formed of, for example, a material including one or more kinds of silicon oxide (SiO), silicon nitride (SiN), silicon oxynitride (SiON), hafnium oxide (HfO), aluminum oxide (AlO), aluminum nitride (AlN), tantalum oxide (TaO), zirconium oxide (ZrO), hafnium oxynitride, hafnium silicon oxynitride, aluminum oxynitride, tantalum oxynitride, and zirconium oxynitride. The insulating layers 13, 16, and 19 may each have a single-layered structure, or may have a layered structure using, for example, two or more kinds of materials such as a SiN film and a SiO film. The insulating layers 13, 16, and 19 are each patterned into a predetermined shape by etching after coating formation, but a pattern may be formed by a printing technique such as ink jet printing, screen printing, offset printing, and gravure printing, depending on the material.

The insulating layer 21 prevents a short circuit between the wiring line 15B and the wiring line 22. It is preferable to use a material having light resistance, as a material of the insulating layer 21. Examples of this material include the materials enumerated above for the insulating layer 44, e.g., organic insulating materials based on silicone, polyimide, polyacrylate, epoxy, cresol novolac, polystyrene, polyamide, fluorine, etc. Besides, the materials enumerated for the insulating layers 13, 16, and 19 may also be used.

For the wiring line 22, it is possible to use the materials enumerated above for the wiring lines 12A, 12B, 15A, and 15B. The wiring line 22 may use the same material as that of 12A, 12B, 15A, and 15B, or may use a material different therefrom. In particular, it is preferable to use Cu. It is to be noted that it is possible to form the wiring lines 12A, 12B, 15A, and 15B as well as the wiring line 22, by, for example, plating, various vapor deposition methods, or sputtering.

The light-emission unit 23 includes, for example, a plurality of solid-state light-emission devices that emit the respective pieces of light in wavelength bands different from each other, from the respective top surfaces. FIG. 5A perspectively illustrates an example of a schematic configuration of the light-emission unit 23. FIG. 5B illustrates an example of a cross-sectional configuration in I-I arrow direction of the light-emission unit 23 in FIG. 5A. Light-emission devices 23AR, 23AG and 23AB are each a solid-state light-emission device that emits light in a predetermined wavelength band from a top surface, and specifically, an LED chip. The LED chip refers to a chip in a state of being cut out from a wafer used for crystal growth, and refers to an LED chip that this is not a package type covered by a molded resin, etc. The LED chip is, for example, of a size of 5 μm or more and 100 mm or less, and is a so-called micro LED. The LED chip has a planar shape, which is, for example, substantially square. The LED chip is a thin piece, and has an aspect ratio (height/width) of, for example, 0.1 or more and less than 1.

The light-emission devices 23AR, 23AG and 23AB are each disposed inside the light-emission unit 23, and, for example, as illustrated in FIG. 5A, the light-emission devices 23AR, 23AG and 23AB are arranged in a line with a predetermined clearance therebetween. At this time, the light-emission unit 23 has, for example, an elongated shape extending in an array direction of the light-emission devices 23AR, 23AG and 23AB. The clearance between adjacent ones of the light-emission devices 23AR, 23AG and 23AB is, for example, equal to or greater than the size of each of the light-emission devices 23AR, 23AG and 23AB. It is to be noted that the above-described clearance may be narrower than the size of each of the light-emission devices 23AR, 23AG and 23AB in some cases.

The light-emission devices 23AR, 23AG and 23AB emit the respective pieces of light in wavelength bands different from each other. For example, the light-emission device 23AG is a light-emission device that emits light in a green light band, the light-emission device 23AR is a light-emission device that emits light in a red color band, and the light-emission device 23AB is a light-emission device that emits light in a blue color band. For example, assume that the light-emission unit 23 has an elongated shape extending in the array direction of the light-emission devices 23AR, 23AG and 23AB. In this case, the light-emission device 23AG is disposed, for example, in proximity to a short side of the light-emission unit 23, and the light-emission device 23AB is disposed, for example, in proximity to a short side, which is different from the short side close to the light-emission device 23AG between the short sides of the light-emission unit 23. The light-emission device 23AR is disposed, for example, between the light-emission device 23AG and the light-emission device 23AB. It is to be noted that the position of each of the light-emission devices 23AR, 23AG and 23AB is not limited to that described above, but a positional relationship of other component may be described below assuming that the light-emission devices 23AR, 23AG and 23AB are disposed at the respective positions exemplified above.

The light-emission devices 23AR, 23AG and 23AB each have, for example, a semiconductor layer in which a first conductive layer, an active layer, and a second conductive layer are stacked in this order (none of which is illustrated). In the light-emission devices 23AG and 23AB, the first conductive layer, the active layer, and the second conductive layer are configured of, for example, an InGaN-based semiconductor material. On the other hand, in the light-emission device 23AR, the first conductive layer, the active layer, and the second conductive layer are configured of, for example, an AlGaInP-based semiconductor material.

An upper electrode 52 is provided on a top surface (a light extraction face S2) of the second conductive layer. The upper electrode 52 is made of titanium (Ti)/platinum (Pt)/gold (Au), for example, in the light-emission devices 23AG and 23AB. The upper electrode 52 is made of a gold-germanium alloy (AuGe)/nickel (Ni)/Au, for example, in the light-emission device 23AR. The upper electrode 52 is in contact with the second conductive layer, and electrically coupled to the second conductive layer. In other words, the upper electrode 52 is in ohmic contact with the second conductive layer. On the other hand, a lower electrode 51 is provided on an undersurface (a back face S1) of the first conductive layer. The lower electrode 51 is a metal electrode. The lower electrode 51 is made of Ti/Pt/Au, for example, in the light-emission devices 23AG and 23AB. The lower electrode 51 is made of AuGe/Ni/Au, for example, in the light-emission device 23AR. The lower electrode 51 is in contact with the first conductive layer, and electrically coupled to the first conductive layer. In other words, the lower electrode 51 is in ohmic contact with the first conductive layer. The lower electrode 51 and the upper electrode 52 may both be configured of a single electrode, or may be configured of a plurality of electrodes. The lower electrode 51 and the upper electrode 52 may include, for example, a metallic material having high reflectivity, such as silver (Ag) and aluminum (Al).

An insulator 50 surrounds the light-emission devices 23AR, 23AG and 23AB at least from side-surface side of the light-emission devices 23AR, 23AG and 23AB, and holds these devices. The insulator 50 is configured of, for example, a resin material such as silicone, acrylic, and epoxy. The insulator 50 may include other material such as polyimide, in a portion thereof. The insulator 50 is formed in contact with the side surface of each of the light-emission devices 23AR, 23AG and 23AB, and the top surface of each of the light-emission devices 23AR, 23AG and 23AB. The insulator 50 has an elongated shape (e.g., a rectangular parallelepiped shape) extending in the array direction of the light-emission devices 23AR, 23AG and 23AB. The insulator 50 has a height more than a height of the light-emission device 23AR, 23AG and 23AB, and the insulator 50 has a width (a width in the short-side direction) more than a width of the light-emission devices 23AR, 23AG, and 23AB. The insulator 50 in itself has a size of, for example, 1 mm or less. The insulator 50 is a thin piece. The insulator 50 has an aspect ratio (maximum height/maximum width) small enough to avoid the light-emission unit 23 lying during transfer of the light-emission unit 23, and is, for example, ⅕ or less.

The driver IC 24 is, for example, a semiconductor device in which a circuit is formed on a surface of a semiconductor substrate (an Si substrate) by utilizing a semiconductor-circuit formation technique.

The light-emission unit 23 and the driver IC 24 may each be a single device, or may be contained in a package, or may be molded by resin, etc., to be a chip component, as described above.

On the light-emission unit 23 and the driver IC 24, the insulating layer 25 and the sealing layer 30 described above are provided. For the insulating layer 25, as with the insulating layer 21, examples of a material include the materials enumerated above for the insulating layer 44, e.g., organic insulating materials based on silicone, polyimide, polyacrylate, epoxy, cresol novolac or polystyrene, polyamide, fluorine, etc. Besides, the materials enumerated for the insulating layers 13, 16, and 19 may be used. For the sealing layer 30, examples of a material include the materials enumerated above for the insulating layer 44, and materials having a large ratio, e.g., 10 or more, of an oxygen transmission rate to a water-vapor transmission rate, e.g., cyclic olefin resin, a nylon resin, a polyethylene resin, etc. It is to be noted that the sealing layer 30 has a thickness of, preferably, for example, around 100 µm, and is, for example, 10 µm or more and 300 µm or less. In a case where the sealing layer 30 is too thin, it is difficult to protect a wiring line and a light source, and in a case where the sealing layer 30 is thick, there is a possibility that a display viewing angle property may deteriorate due to vignetting of light emission at an end face.

It is to be noted that the display unit 1 in the present embodiment is not provided with a peripheral circuit, a sealing section, etc. provided at a peripheral edge portion in an ordinary display unit, and has a similar layered structure on the entire surface of the substrate 10. Specifically, the layered structure of the insulating layer 25 and the sealing layer 30 on the substrate 10 of the display unit 1 extends to an end face of the substrate 10.

FIG. 6 illustrates an overall configuration of a tiling display, in which the display unit 1 of the disclosure is provided as each of a plurality of display panels combined (here, a total of four display panels 3A, 3B, 3C, and 3D). Here, the display panels 3A to 3D each have a configuration similar to that of the display unit 1 described above. The display panels 3A to 3D are arranged, for example, two-dimensionally, in a 2×2 region, and it is possible to display an image by combining display regions of the respective display panels 3A to 3D. It is to be noted that "A" and "B" and orientations thereof in FIG. 6 schematically represent a type and an arrangement state of a backplane used. The type and layout of the backplane used in each of the display panels 3A to 3D will be described later.

In this tiling display, for example, the driver IC 24 for display driving is coupled to each of the display panels 3A to 3D. Specifically, in the display panel 3A, for example, a signal-line driving circuit 120A and a scanning-line driving circuit 130A are implemented by, for example, a COF (Chip on film) 140. It is to be noted that, as illustrated in FIG. 1, these driver ICs may be directly formed (built) in the display panel 3A, or may be implemented by other technique, e.g., COG (Chip on glass). Further, in a case where the light-emission unit 23 described above is used as a display device, a power-line driving circuit (not illustrated) is additionally coupled to the display panel 3A. To the display panel 3B, for example, a signal-line driving circuit 120B and a scanning-line driving circuit 130B are coupled through the COF 140, as with the display panel 3A. Similarly, for example, a signal-line driving circuit 120C and a scanning-line driving circuit 130C are coupled to the display panel 3C through the COF 140, and, for example, a signal-line driving circuit 120D and a scanning-line driving circuit 130D are coupled to the display panel 3D through the COF 140.

Both of the signal-line driving circuits 120A to 120D and the scanning-line driving circuits 130A to 130D are coupled to the drive control section 110. On the basis of an image signal Din inputted from outside, independent display driving control is allowed in each of the display panels 3A to 3D. A drive control section 110 includes, for example, a timing controller 111, and gamma adjustment sections 112a to 112d.

The display panels 3A to 3D each have a plurality of pixels P disposed in a matrix. Active matrix driving of each of the pixels P is performed by display driving by the signal-line driving circuits 120A to 120D and the scanning-line driving circuits 130A to 130D, and the display panels 3A to 3D each thereby perform image display on the basis of the image signal Din inputted from outside. It is to be noted that, in each of the figures, the quantity, pitch, size, etc., of the pixels P and terminal sections 130 to be described later are illustrated in a simple manner for convenience of description, and different from actual ones.

The display panels 3A to 3D each have a plane shape of, for example, a rectangle or square (here, rectangle). The display panels 3A to 3D are disposed next to each other to be shaped like tiles as a whole. Specifically, the display panels 3A to 3D are laid edge to edge, for example, on a housing or substrate, etc. not illustrated. A region formed by combining the display regions of the respective display panels 3A to 3D is a display region (a display region 100) of the display unit 1. It is to be noted that the description will be provided below using the display panel 3A as a representative example, in a case where the display panels 3A to 3D are not distinguished from each other in particular.

FIG. 7A illustrates a configuration of a backplane 41A, and FIG. 7B illustrates a configuration of a backplane 41B. As illustrated in FIG. 7A, the backplane 41A has a pixel circuit 150 for each of the pixels P, in a region (a region 10A) corresponding to a portion of the display region 100. In other words, the plurality of pixel circuits 150 are two-dimensionally arranged in the backplane 41A. The terminal section 130 for implementation is disposed in regions X1 and Y1 along rectangular two sides of a peripheral region of a formation region (i.e., the region 10A) of the pixel circuits 150. Specifically, the plurality of terminal sections 130 are disposed along the two sides on left side and upper side among four rectangular sides arranged right, left, upper, and lower sides. The terminal section 130 is a pad for wiring connection to each of circuits including the signal-line driving circuits 120A to 120D or the scanning-line driving circuits 130A to 130D. On the other hand, as illustrated in FIG. 7B, the backplane 41B has the pixel circuit 150 for each of the pixels P in a region (a region 23AB 10B) corresponding to a portion of the display region 100 (the plurality of pixel circuits 150 are two-dimensionally arranged in the backplane 41B). The terminal section 130 for implementation is disposed in regions X2 and Y2 along two rectangular sides of a peripheral region of a formation region (i.e., the region 23AB) of the pixel circuits 150. Specifically, the plurality of terminal sections 130 are disposed, for example, along two sides on left side and lower side among four of right, left, upper, and lower rectangular sides. In this way, the backplanes 41A and 11B 41B are different in terms of, for example, a layout (for example, positions) of the terminal sections 130.

Of the backplanes 41A and 41B, the backplane 41A is disposed, for example, in each of the display panels 3A and 3D, and the backplane 41B is disposed in each of the display panels 3A and 3C. In other words, the backplane 41A is used for a pair of the display panels 3A and 3D as backplanes of the same type, and the backplane 41B is used for a pair of the display panels 3A and 3C as backplanes of the same type. It is to be noted that the "types" of the backplane are distinguished from each other, for example, depending on the layout of the pixel circuits 150 and the terminal sections 130, and the "same type" means that, for example, the layouts in terms of the pixel circuits 150 and the terminal sections 130 are substantially the same. In other words, backplanes suffice as long as these backplanes are almost equal in terms of the positions, shapes, quantity, etc. of the pixel circuits 150 and the terminal sections 130, and may have some errors in design, and backplanes in which local layout modifications are made, etc. are also included.

As illustrated in FIG. 6, the timing controller 111 of the drive control section 110 controls, for example, each of circuits including the signal-line driving circuits 120A to 120D and the scanning-line driving circuits 130A to 130D to operate in conjunction with each other. The timing controller 111 outputs, for example, a control signal to each of the above-described circuits, in response to the image signal Din inputted from outside.

The gamma adjustment sections 112a to 112d are individually provided for the display panels 3A to 3D, respectively. The gamma adjustment sections 112a to 112d each perform, for example, a gamma adjustment (a gamma correction) on the digital image signal Din inputted from outside, and output a thus-obtained image signal to the signal-line driving circuits 120A to 120D. Specifically, the gamma adjustment section 112a makes a gamma adjustment to the display panel 3A, the gamma adjustment section 112b makes a gamma adjustment to the display panel 3B, the gamma adjustment section 112c makes a gamma adjustment to the display panel 3C, and the gamma adjustment section 112d makes a gamma adjustment to the display panel 3D. It is to be noted that, in the drive control section 110, signal processing other than the gamma adjustment, e.g., an overdrive correction may be performed.

The signal-line driving circuits 120A to 120D apply, to each of signal lines DTL, analog signal voltages corresponding to the image signals input from the gamma adjustment sections 112a to 112d, in response to the control signal from the timing controller 111, for example.

The scanning-line driving circuits 130A to 130D each select, for example, a plurality of scanning lines WSL sequentially for each predetermined unit, in response to the control signal from the timing controller 111. For example, the scanning-line driving circuits 130A to 130D each effect execution of Vth correction, signal-voltage writing, μ correction, etc. in a desired order, by selecting one or more of the scanning lines WSL in a predetermined sequence. Here, the Vth correction refers to a correction operation of bringing a voltage Vgs held between a gate and a source of a drive transistor Tr1 close to a threshold voltage of a drive transistor. The signal-voltage writing refers to an operation of writing a signal voltage to the gate of the drive transistor Tr1 through a write transistor Tr2. The μ correction refers to an operation of correcting the voltage Vgs held between the gate and the source of the drive transistor Tr1, depending on a size of a mobility μ of the drive transistor Tr1.

(1-3. Working and Effect)

As described above, in a wiring board in which a conductive pattern and a resin layer covering the conductive pattern are provided on a surface of a substrate, there is a possibility that ionic migration occurs at a live part of the conductive pattern due to entering of moisture from outside, and thereby a short circuit occurs between wiring lines. In general, measures for suppressing the occurrence of the ionic migration include increasing a wiring interval, lowering a voltage between wiring lines, reducing remaining ions in a resin that couple to copper (Cu) serving as a wiring material, and providing a member that suppresses entering of moisture from outside. However, a wiring interval, a voltage, and a resin material are determined by other factors in designing a device in many cases and thus, it is difficult to make a modification for suppression of the occurrence of the ionic migration. Hence, providing a member of suppressing entering of moisture from outside is selected as a measure for suppressing the occurrence of the ionic migration, and there is manufactured a display unit in which a barrier layer (an inorganic barrier layer) made of an inorganic material is deposited on a substrate, or an inorganic barrier film is attached.

Meanwhile, it is desired to improve performance of an electronic device, and in particular, in a display unit, etc., enlargement of a display region and increase in definition are desired. In a case where the display region is enlarged, a signal delay occurs due to a load caused by wiring line resistance and parasitic capacitance. Further, in a case where the definition is increased, density of a wiring layer forming wiring lines and signal lines for driving increases as the number of pixels increases. Therefore, a short circuit between wiring lines easily occurs, and a manufacturing yield decreases. There is used a multilayered wiring board, in which a wiring layer forming various wiring lines is multilayered to improve such a signal delay and a decrease in manufacturing yield, and in which, to avoid a signal delay due to the formation of the multilayer, density of the wiring layer is increased and a footprint of an electronic component is increased using an insulating layer, which is made of an organic resin, etc. having a low dielectric constant, between the wiring layers.

The multilayered wiring board includes, for example, a base material having an insulation property, and an organic resin material such as epoxy resin. A substrate (an organic substrate) formed using an organic resin material easily absorbs and transmits moisture, as compared with a substrate (an inorganic substrate) formed from an inorganic material such as a glass or silicon substrate. For example, in a glass epoxy substrate, which is an organic substrate, a water-vapor transmission rate (WVTR) varies depending on quality of a material, a wiring pattern, the number of stacked layers of wiring lines formed inside, etc., but is approximately in a range of 10 to 20 g/m$^2$/day, and a water absorption rate is about 1%, which is not small. In addition, moisture not only enters from a direction perpendicular to a substrate surface, but also enters from an end face. Moreover, for the multilayered wiring board, there is a cleaning process in photolithography, etc. used in forming the wiring line and the insulating layer, and moisture is easily absorbed into the substrate in this process. For this reason, it is necessary to sufficiently dry the organic substrate before providing an inorganic barrier layer. However, sufficiently reducing entering of moisture into the organic substrate is not achievable by merely providing the inorganic barrier layer on the organic substrate.

FIG. 8 illustrates a simulation of a moisture entering distribution in a case where a device substrate 200, in which an inorganic barrier layer 450 is provided on a glass-epoxy substrate used as a base material of a multilayered wiring board, is left at a high temperature and a high humidity for a predetermined length of time. As with the device substrate 2 of the disclosure illustrated in FIG. 2, the device substrate 200 has a configuration in which a wiring line and a light-emission unit (a wiring layer) are provided on the glass-epoxy substrate, these are covered by an insulating material having a moisture permeability equal to that of the glass-epoxy substrate, and the inorganic barrier layer 450 is provided on a surface thereof. As apparent from FIG. 8, in a case where the inorganic barrier layer 450 is provided on a substrate 410, entering of moisture from a surface of the inorganic barrier layer 450 is prevented, but moisture enters from an end face and a back surface, on which the inorganic barrier layer 450 is not provided, of the substrate 410. In other words, it is found that in a case where an organic substrate is used, entering of moisture into a wiring line, etc. on the organic substrate is not preventable by merely forming an inorganic barrier layer on a surface. In addition, this simulation presumes that an initial moisture distribution in the substrate is uniform, but actually, the initial moisture distribution in the substrate is not uniform, and a large amount of moisture may be locally present or gas may also be generated from an organic resin material.

Hence, there is such an issue that, in order to prevent entering of moisture in a display unit that uses a multilayered wiring board, it is necessary to provide an inorganic barrier layer not only on a surface of a substrate provided with an electronic device, but also on an end face and a back surface of the substrate, which results in an increase in cost.

Moreover, in terms of property of an organic resin material that is a base material, the multilayered wiring board easily contains moisture, and gas is easily generated inside a substrate. In a case where an inorganic barrier layer having a high barrier property is provided on a surface of the multilayered wiring board, the moisture contained in the substrate and the gas generated from the organic resin material are trapped and thus, there is a possibility that a void occurs due to feeling off of an interface having weak adhesion. In this way, in the case where entering of moisture is prevented by providing the inorganic barrier layer on the surface of the multilayered wiring board, there is such an issue that sufficient waterproofing effects are not obtainable and moreover, a film is caused to peel off.

In contrast, in the display unit 1 of the present embodiment, the sealing layer 30 including the resin material having the oxygen transmission rate higher than the water-vapor transmission rate is provided on the insulating layer 25 that covers the wiring line 22, the light-emission unit 23, etc. provided on the substrate 10. Table 2 provides occurrence of ionic migration between wiring lines and occurrence of a void in a high-temperature high-humidity environment, in a comparison between a case where the sealing layer 30 formed of a resin material (e.g., a cyclic olefin resin) having an oxygen transmission rate higher than a water-vapor transmission rate is provided on the insulating layer 25 that covers the wiring line 22, the light-emission unit 23, etc., and a case where an inorganic barrier layer is provided in place of the sealing layer 30. Here, the high-temperature high-humidity environment is an environment with a temperature of 60° C. and a humidity of 90%. In this way, forming the sealing layer 30 by using the cyclic olefin resin makes it possible to moderately diffuse, to outside, moisture contained in the substrate and gas likely to be generated from the organic resin material of the substrate 10.

TABLE 2

| | Occurrence of ionic migration between wiring lines at application of voltage in 60° C. 90% environment | Occurrence of void at application of voltage in 60° C. 90% environment |
| --- | --- | --- |
| Cyclic olefin resin | 500 hours or more | None |
| Film with barrier inorganic film | Several tens of hours | Void occurred |

As described above, in the present embodiment, the sealing layer 30 including the resin material having the oxygen transmission rate higher than the water-vapor transmission rate is provided on the insulating layer 25 that covers the wiring line 22, the light-emission unit 23, etc. provided on the substrate 10. This makes it possible to moderately diffuse, to outside, the moisture contained in the substrate and the gas likely to be generated from the organic resin material structuring the substrate 10. It is therefore possible to reduce occurrence of film peeling at an interface of a laminated film, while suppressing entering of moisture from outside. In other words, it is possible to provide a display unit, in which ionic migration tolerance is high and occurrence of a void is reduced, at low cost.

2. Application Example

The display unit 1 (and the tiling display including this unit) described in the above-described embodiment is applicable to display units of electronic apparatuses in various fields that display image signals inputted from outside or image signals generated inside, as a still image or a moving image. Examples of the electronic apparatuses include television apparatuses, digital cameras, laptop personal computers, mobile terminals such as mobile phones, video cameras, etc. Examples thereof will be described below.

FIG. 8 illustrates an appearance of a television apparatus to which the display unit 1 of the above-described embodiment is applied. This television apparatus has, for example, an image-display screen section 300 including a front panel 310 and a filter glass 320. The above-described display unit 1 is applied to the image-display screen section 300.

The disclosure is described above by referring to the embodiment and the modification example, but the disclosure is not limited to the above-described embodiment and modification example, and various modifications may be made. For example, the material and thickness, or the film formation method and film formation conditions of each of the layers, or the disconnection and repair for short circuit defects, etc. described in the above-described embodiment are not limitative. Other material and thickness, or film formation method and film formation conditions, or disconnection and repairing method may be adopted.

Moreover, in the present embodiment, the light-emission unit 23 is used as the electronic device, but, for example, a photodetector may be used.

It is to be noted that the effects described herein are mere examples without being limitative, and other effects may also be provided.

It is to be noted that the technology may adopt the following configurations.
(1) A display unit including:
a substrate;
a wiring line and a light-emission section that are provided on the substrate;
an insulating layer covering the wiring line and the light-emission section, and provided on an entire surface of the substrate; and
a sealing layer provided on an entire surface of the insulating layer, and including a resin material having an oxygen transmission rate higher than a water-vapor transmission rate.
(2) The display unit according to (1), in which a ratio of the oxygen transmission rate to the water-vapor transmission rate of the resin material is 10 or more.
(3) The display unit according to (1) or (2), in which the sealing layer has a moisture permeability less than ten times a moisture permeability of the substrate.
(4) The display unit according to any one of (1) to (3), in which the resin material comprises a cyclic olefin resin, a nylon resin, or a polyethylene resin.
(5) The display unit according to (4), in which the cyclic olefin resin comprises an addition polymerization cycloolefin resin or a ring-opening polymerization cycloolefin resin.
(6) The display unit according to any one of (1) to (5), in which a layered structure having the wiring line and the light-emission section that are provided on the substrate, the insulating layer, and the sealing layer in this order extends to an end face of the substrate.
(7) The display unit according to any one of (1) to (6), in which the insulating layer is attached to the insulating layer with an intermediate layer interposed therebetween.
(8) The display unit according to (7), in which the intermediate layer comprises an adhesive layer or a bonding layer.
(9) The display unit according to any one of (1) to (8), in which the light-emission section comprises a light-emitting diode.
(10) The display unit according to any one of (1) to (9), in which the substrate includes an organic base material.
(11) The display unit according to (10), in which the organic base material comprises a polyester resin, an epoxy resin, or a polyimide resin.

This application is based upon and claims the benefit of priority of the Japanese Patent Application No. 2015-123611 filed with the Japan Patent Office on Jun. 19, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A display unit, comprising:
a substrate that comprises a base material;
a plurality of wiring lines on the substrate, wherein
a first wiring line of the plurality of wiring lines and a second wiring line of the plurality of wiring lines are on a front surface of the base material, and
a third wiring line of the plurality of wiring lines and a fourth wiring line of the plurality of wiring lines are on a back surface of the base material;
a first insulating layer between the first wiring line and the second wiring line;
a light-emission section on the substrate;
a second insulating layer on an entire surface of the substrate, wherein
the second insulating layer covers a fifth wiring line of the plurality of wiring lines and the light-emission section,
the fifth wiring line is on a portion of the second wiring line on the front surface,
the second insulating layer is in contact with the fifth wiring line, and
the second insulating layer comprises cresol novolac;
a third insulating layer between the fifth wiring line and the second wiring line,
wherein the third insulating layer comprises at least one of hafnium oxide, hafnium oxynitride, hafnium silicon oxynitride, or tantalum oxide;
a fourth insulating layer between the third wiring line and the fourth wiring line,
wherein each of the first insulating layer and the fourth insulating layer comprises a silicon nitride film and a silicon oxide film;
an intermediate layer on the second insulating layer; and
a sealing layer on an entire surface of the intermediate layer, wherein
the intermediate layer is one of an adhesive layer or a bonding layer configured to bond the sealing layer and the second insulating layer,
the second insulating layer is between the third insulating layer and the intermediate layer,
the sealing layer comprises a resin material having an oxygen transmission rate higher than a water-vapor transmission rate, and
the sealing layer has a moisture permeability less than ten times a moisture permeability of the substrate.
2. The display unit according to claim 1, wherein a ratio of the oxygen transmission rate to the water-vapor transmission rate of the resin material is greater than 10 and less than or equal to 3520.
3. The display unit according to claim 1, wherein the resin material comprises one of a cyclic olefin resin, a nylon resin, or a polyethylene resin.

4. The display unit according to claim 3, wherein the cyclic olefin resin comprises one of an addition polymerization cycloolefin resin or a ring-opening polymerization cycloolefin resin.

5. The display unit according to claim 1, wherein the fifth wiring line, the light-emission section, the second insulating layer, and the sealing layer constitute a layered structure that extends to an end face of the substrate.

6. The display unit according to claim 1, wherein the light-emission section comprises a light-emitting diode.

7. The display unit according to claim 1, wherein the base material is an organic base material.

8. The display unit according to claim 7, wherein the organic base material comprises one of a polyester resin, an epoxy resin, or a polyimide resin.

9. The display unit according to claim 7, wherein the sealing layer extends to an end face of the substrate, and a thickness of the sealing layer is between 10 μm and 300 μm.

10. The display unit according to claim 1, wherein the third insulating layer is between the second insulating layer and the substrate.

* * * * *